US007605027B2

(12) United States Patent
Meunier-Beillard et al.

(10) Patent No.: US 7,605,027 B2
(45) Date of Patent: Oct. 20, 2009

(54) METHOD OF FABRICATING A BIPOLAR TRANSISTOR

(75) Inventors: Philippe Meunier-Beillard, Kortenberg (BE); Erwin Hijzen, Blanden (BE); Johannes J. T. M. Donkers, Valkenswaard (NL); Francois Neuilly, Colomby-sur-Thaon (FR)

(73) Assignee: NXP B.V., Eindhoven (NL)

(*) Notice: Subject to any disclaimer, the term of this patent is extended or adjusted under 35 U.S.C. 154(b) by 36 days.

(21) Appl. No.: 11/913,049

(22) PCT Filed: Apr. 24, 2006

(86) PCT No.: PCT/IB2006/051262

§ 371 (c)(1),
(2), (4) Date: May 13, 2008

(87) PCT Pub. No.: WO2006/117712

PCT Pub. Date: Nov. 9, 2006

(65) Prior Publication Data

US 2008/0233688 A1    Sep. 25, 2008

(30) Foreign Application Priority Data

Apr. 29, 2005 (EP) ................................. 05103583

(51) Int. Cl.
*H01L 21/00* (2006.01)
*H01L 21/84* (2006.01)

(52) U.S. Cl. ..................... 438/154; 438/311; 438/313; 257/E21.372

(58) Field of Classification Search ................ 438/154, 438/311, 313; 257/E21.372, E21.7
See application file for complete search history.

(56) References Cited

U.S. PATENT DOCUMENTS

| 4,519,128 | A | * | 5/1985 | Chesebro et al. | 438/433 |
|---|---|---|---|---|---|
| 4,887,144 | A | * | 12/1989 | Cook et al. | 257/513 |
| 5,747,871 | A | * | 5/1998 | Lee et al. | 257/586 |
| 6,020,250 | A | * | 2/2000 | Kenney | 438/422 |
| 6,482,710 | B2 | * | 11/2002 | Oda et al. | 438/311 |
| 6,506,657 | B1 | * | 1/2003 | Essaian | 438/318 |
| 6,657,242 | B1 | * | 12/2003 | Norstrom et al. | 257/197 |
| 2003/0082882 | A1 | * | 5/2003 | Babcock et al. | 438/309 |
| 2004/0104448 | A1 | * | 6/2004 | Marty et al. | 257/517 |
| 2004/0195645 | A1 | * | 10/2004 | Chen | 257/526 |

FOREIGN PATENT DOCUMENTS

EP    1406307 A    4/2004

* cited by examiner

*Primary Examiner*—Thanh V Pham
*Assistant Examiner*—Duy T Nguyen

(57) ABSTRACT

A method of fabricating a bipolar transistor in a first trench (11) is disclosed wherein only one photolithographic mask is applied which forms a first trench (11) and a second trench (12). A collector region (21) is formed self-aligned in the first trench (11) and the second trench (12). A base region (31) is formed self-aligned on a portion of the collector region (21), which is in the first trench (11). An emitter region (41) is formed self-aligned on a portion of the base region (31). A contact to the collector region (21) is formed in the second trench (12) and a contact to the base region (31) is formed in the first trench (11). The fabrication of the bipolar transistor may be integrated in a standard CMOS process.

6 Claims, 4 Drawing Sheets

METHOD OF FABRICATING A BIPOLAR TRANSISTOR

Figure 1:
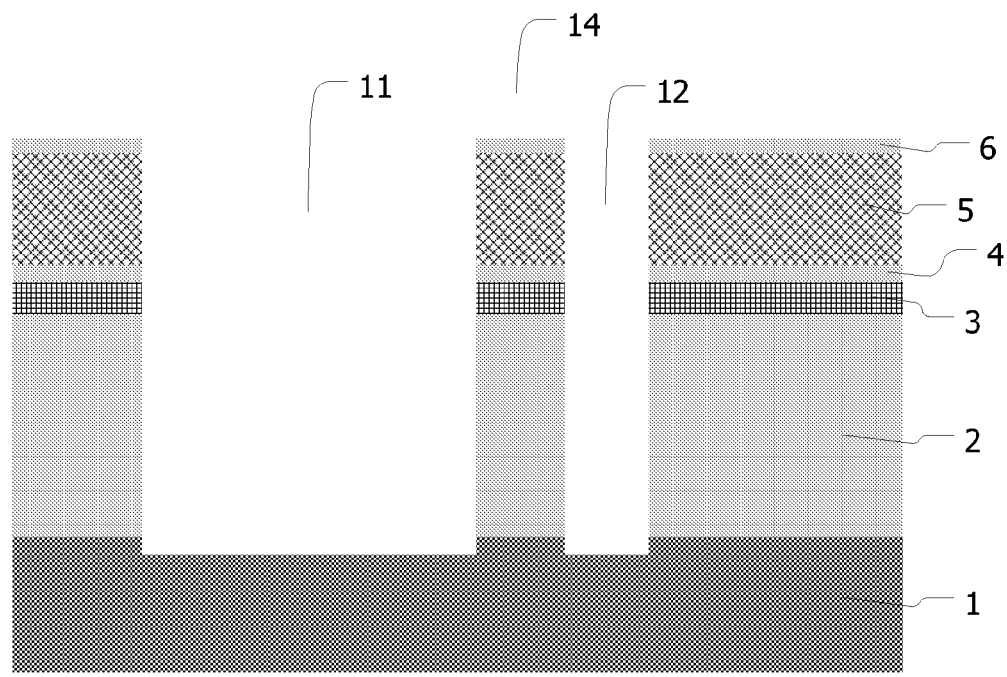

This invention relates to a method of fabricating a bipolar transistor.

U.S. Pat. No. 6,506,657 discloses a method for fabricating a bipolar transistor in a trench. A first stack of layers is formed on a semiconductor substrate and a second stack of layers is formed on the first stack of layers. The trench comprises a deep trench component exposing the semiconductor substrate and a shallow trench component exposing the deep trench component and the first stack of layers. The deep and the shallow trench components are formed by applying two separate photolithographic masking steps in which one side of the deep trench component coincides with one side of the shallow trench component. Then, the deep trench component is filled with selectively grown epitaxial silicon. Thereafter a non-selectively grown epitaxial silicon layer is formed in the shallow trench component on the selectively grown epitaxial silicon and on the exposed portion first stack of layers, thereby forming a collector region. Then, a base region is formed on the collector region using silicon dioxide spacers. Subsequently an emitter region is formed on a portion of the base region that extends over the collector region. The collector region is contacted on a portion of the collector region, which is on the first stack of layers. The base region is contacted on a portion of the base region, which is adjacent to the trench. A disadvantage of this method is that two masking steps are needed to form the trench in which the bipolar transistor is fabricated and an additional two masking steps are needed to form the base region and the emitter region. Another disadvantage is that two different epitaxial growth steps are required to form the collector region.

It is an object of the invention to provide a method for fabricating a bipolar transistor in a trench with one masking step. According to the invention, this object is achieved by providing a method as claimed in claim 1.

A stack of layers is provided on a semiconductor substrate, the stack of layers comprising in that order a first isolation layer, a first semiconductor layer, a second isolation layer and a second semiconductor layer, in which the first isolation layer extends over the semiconductor substrate. Then a first trench and a second trench are formed in the stack of layers and in a portion of the semiconductor substrate. The first trench and the second trench are separated by a protrusion, which comprises a first portion of the semiconductor substrate. Next, the first portion of the semiconductor substrate is removed, thereby creating an underpass region between the first and the second trench, exposing a portion of the semiconductor substrate. Subsequently, a collector region is formed self-aligned on the exposed portions of the semiconductor substrate and a sealing region is formed on the exposed portions of the first semiconductor layer and the second semiconductor layer. The sealing region seals the second trench. A portion of the collector region fills the underpass region. Thereafter, a base region is formed self-aligned to and extending over a portion of the collector region. Because the second trench is sealed by the sealing region, the base region cannot be formed in the second trench. Thereafter, an emitter region is formed self-aligned on the exposed portion of the base region in the first trench by applying spacers, which are formed in the first trench.

An advantage of this method is that only one photolithographic mask is required to form a bipolar transistor in a trench while the collector region, the base region and the emitter region are all formed self-aligned. Another advantage is that the collector region is formed with one fabrication step. Yet another advantage is that the base to collector capacitance is reduced because the base to collector area is reduced.

In a first embodiment a collector contact is formed on a portion of the collector region in the second trench.

In a second embodiment a base contact is formed on a portion of the base region in the first trench extending over the collector region.

In a third embodiment the base region is also extends over the protrusion and a base contact is formed on a portion of the base region which is extending over the protrusion.

In a fourth embodiment the method is integrated in a standard CMOS fabrication process in which a CMOS transistor device comprises a gate electrode layer and a gate dielectric layer. The gate dielectric layer comprises the second isolation layer and the gate electrode layer comprises the second semiconductor layer.

These and other aspects of the invention will be further elucidated and described with reference to the drawings, in which:

FIGS. 1-8 illustrate cross-sectional views of an embodiment according the invention.

The Figures are not drawn to scale. In general, identical components are denoted by the same reference numerals in the Figures.

The starting point is a silicon-on-insulator (SOI) substrate, which comprises a silicon substrate region 1 on which successively a silicon dioxide region 2 and a silicon region 3 extend. A silicon dioxide layer 4 is formed on the silicon region 3 using a standard fabrication technique, for example thermal oxidation. On the silicon dioxide layer 4 a polysilicon layer 5 is deposited using standard fabrication techniques. Then a hard mask layer 6 is formed on the polysilicon layer 5, the hard mask layer 6 comprising for example silicon dioxide or another insulating material. The silicon dioxide layer 4 may comprise a gate oxide layer of a CMOS transistor, and the polysilicon layer 5 may comprise a gate electrode layer of the CMOS transistor. As is illustrated in FIG. 1, a first trench 11 and a second trench 12 are etched up to and including a part of the silicon substrate region 1 using standard photolithographic and etching techniques. As a result, the first trench 11 and the second trench 12 are separated by a protrusion 14, which comprises a first portion of the silicon substrate region 1, a portion of the silicon dioxide region 2, a portion of the silicon region 3, a portion of the silicon dioxide layer 4, a portion of the polysilicon layer 5 and a portion of the hard mask layer 6.

Figure 2:
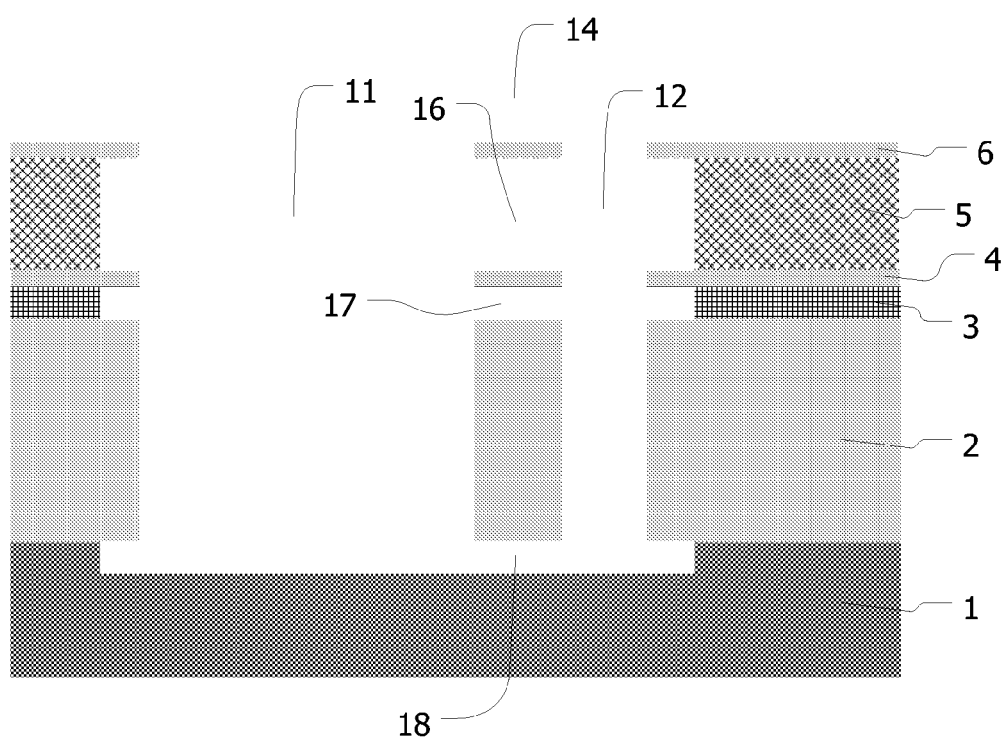

An isotropic etch is applied to remove the first portion of the silicon substrate region 1 from the protrusion 14, as is illustrated in FIG. 2. In this case also the polysilicon layer 5 and the silicon region 3 are removed from the protrusion 14. Because an isotropic etch is applied, also the other semiconductor regions and layers, that are exposed in the trenches, are partially etched and removed. As a result of this isotropic etch, the protrusion extends over an underpass region 18, which connects the first trench 11 and the second trench 12. The underpass region 18 exposes a portion of the semiconductor substrate 1. Furthermore, the protrusion 14 comprises a first space region 17, which previously was filled with a portion of the silicon region 3, and a second spacer region 16, which previously was filled with a portion of the polysilicon layer 5.

Figure 3:
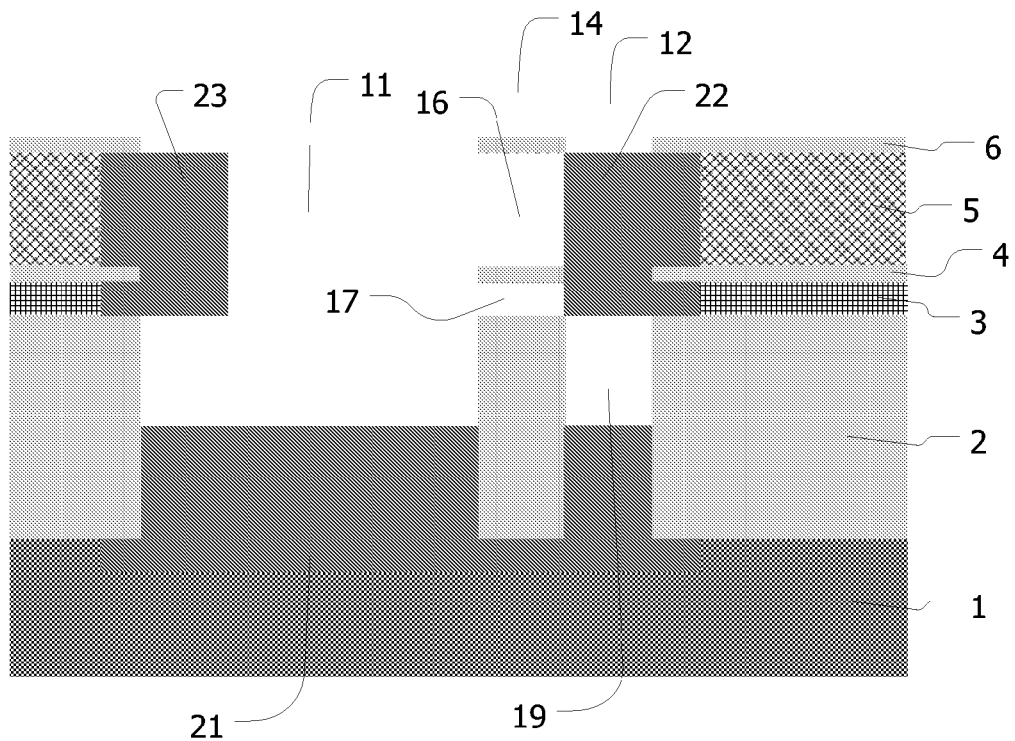

The next step is to form a semiconductor material only on the exposed semiconductor regions and layers. For this purpose a selective epitaxial growth step is applied which forms, in this case, silicon regions on the exposed semiconductor regions and layers only, as is illustrated in FIG. 3. A first result of the selective epitaxial growth step is a collector region 21 on the silicon substrate region 1 that is exposed in the first trench 11 and the second trench 12. The collector region 21 comprises silicon, because it is formed on the silicon substrate region 1. A portion of the collector region 21 fills the underpass region 18 completely. The second result of the epitaxial growth step is a sealing region 22, which seals the second trench 12. The third result is a sidewall region 23, which is formed on the exposed portions of the silicon region 3 and the polysilicon layer 5 in the first trench 11. The sealing region 22 and the sidewall region 23 both comprise (mono-) silicon and polysilicon, because the regions are grown from the (mono-)silicon region 3 and the polysilicon layer 5. The combination of the filled underpass region 18 and the sealing region 22 forms a third space region 19, which is sealed from the outside environment by these regions. After this fabrication step the width of the first trench 11 should be such that the first trench 11 is not sealed by the sidewall region 23 and the width of the second trench 12 should be such that the second trench 12 is sealed by the sealing region 22. This fabrication step forms the collector region 21 self-aligned in one fabrication step without applying a photolithographic mask, and, as will be shown in a later stage of the fabrication process, a contact to the collector region 21 may be fabricated on a portion of the collector region 21 in the second trench 12.

Figure 4:
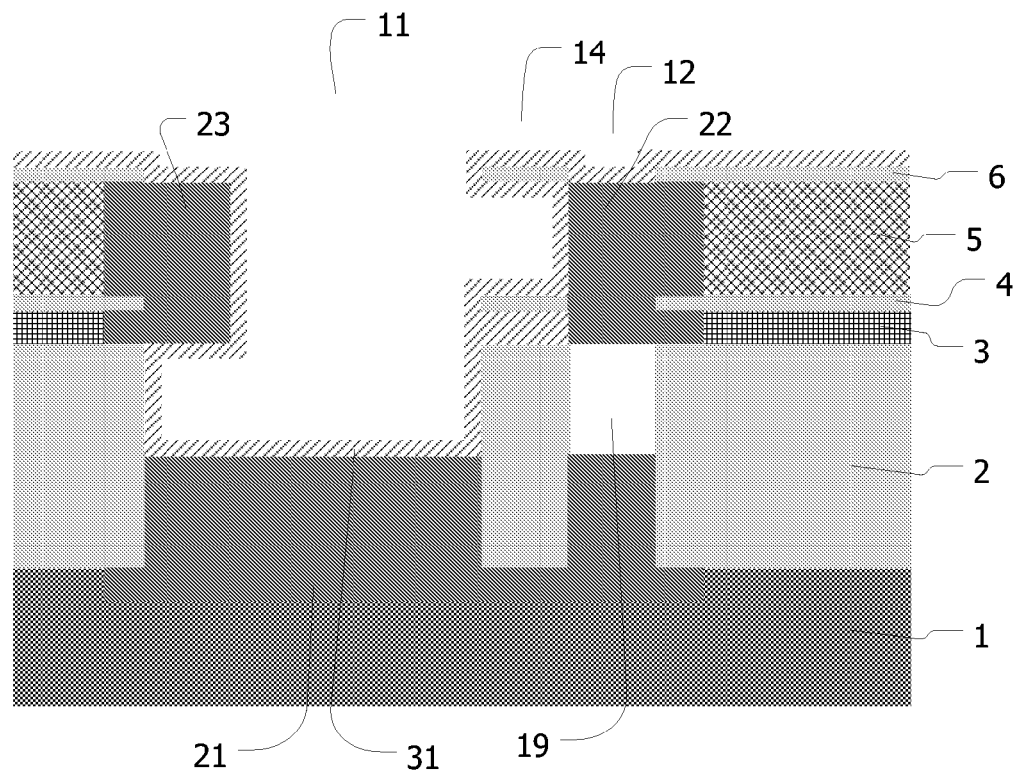

As is illustrated in FIG. 4, a non-selective epitaxial growth may be used to form a base region 31 on all exposed areas. In particular, the base region 31 comprises (mono-)silicon on the exposed portion of the collector region 21 in the first trench 11. Further, the base region 31 comprises (mono-)silicon on the exposed portions of the sealing region 22 and the sidewall region 23, which exposed portions comprise (mono-)silicon, and polysilicon on further exposed portions of the sealing region 22 and the sidewall region 23, which further exposed portions comprise polysilicon,. On the remaining exposed areas the base region 31 comprises polysilicon. In this case the first spacer region 17 is filled with a portion of the base region 31. The portion of the base region 31, which extends over the collector region 21, forms the active part of the to be fabricated bipolar transistor. In this way the base region 31 is formed completely self-aligned to the collector region 21 without applying a photolithographic mask.

Figure 5:
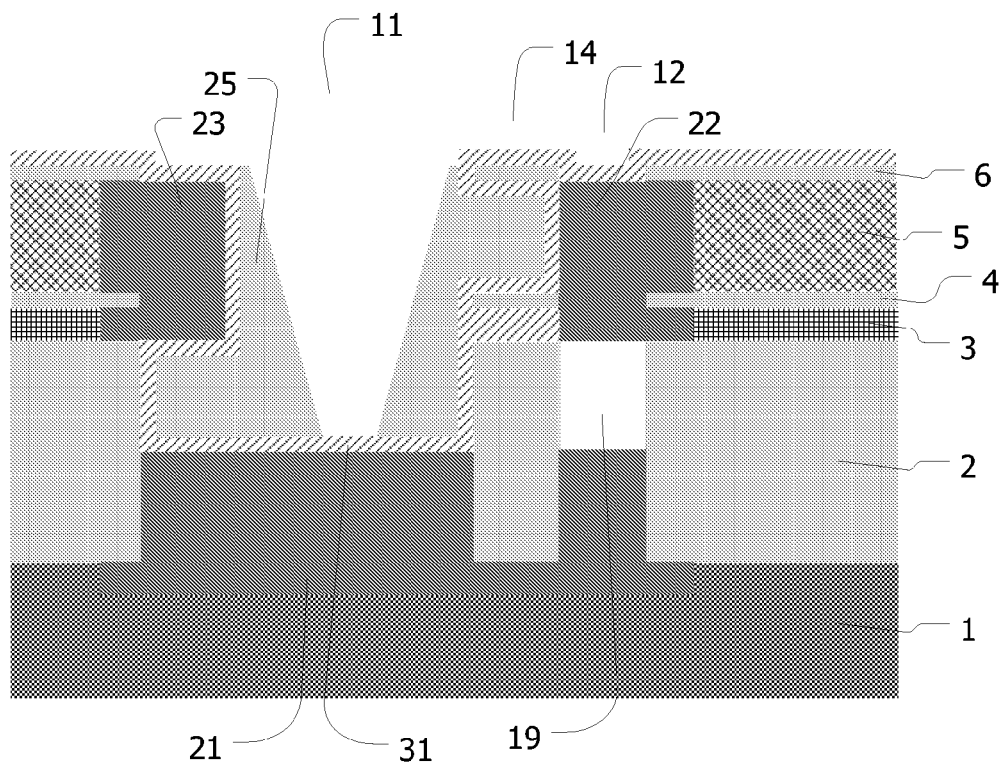

Next, spacers 25 are formed in the first trench 11 using standard spacer forming techniques. The spacers 25 comprise an isolation material, such as silicon dioxide. As is illustrated in FIG. 5, the second space region 16 is filled with the isolation material of the spacers 25 after this fabrication step. Further, after the forming of the spacers 25 a portion of the base region 31 is exposed.

Figure 6:
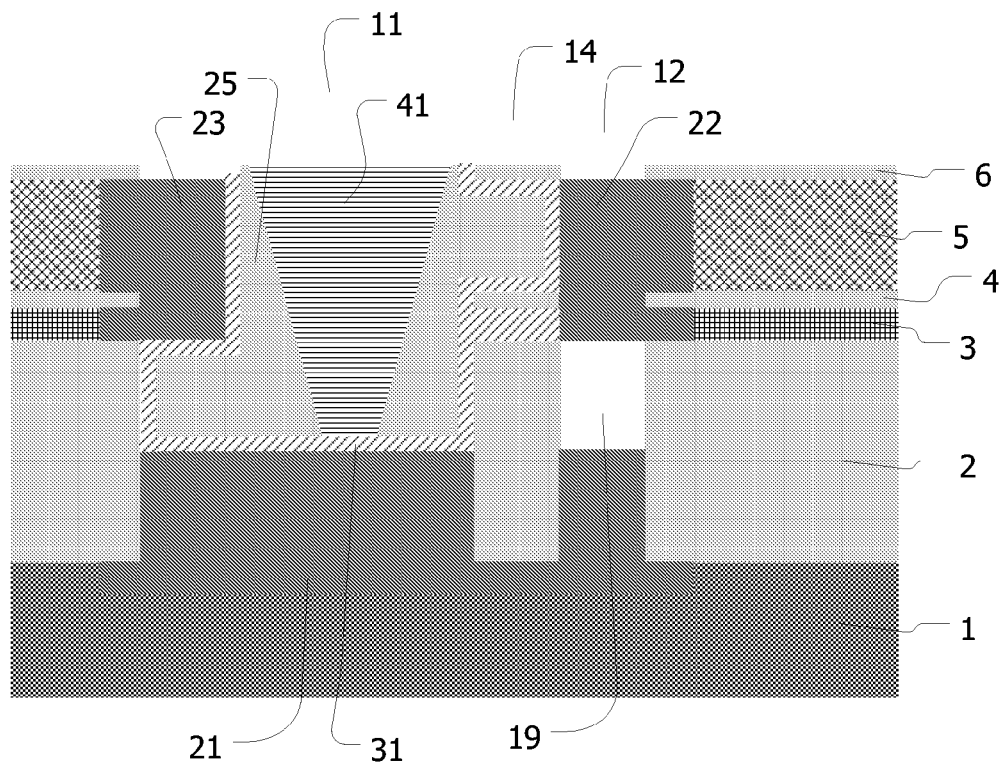

As is illustrated in FIG. 6, an emitter region 41, comprising for example polysilicon, is formed in a portion of the first trench 11 which is not filled with the spacers 25. This is achieved by deposition of polysilicon followed by a planarization step, for example chemical mechanical polishing, thereby exposing the hard mask layer 6. At this point a bipolar transistor is formed which comprises the emitter region 41, the base region 31 and the collector region 21.

Figure 7:
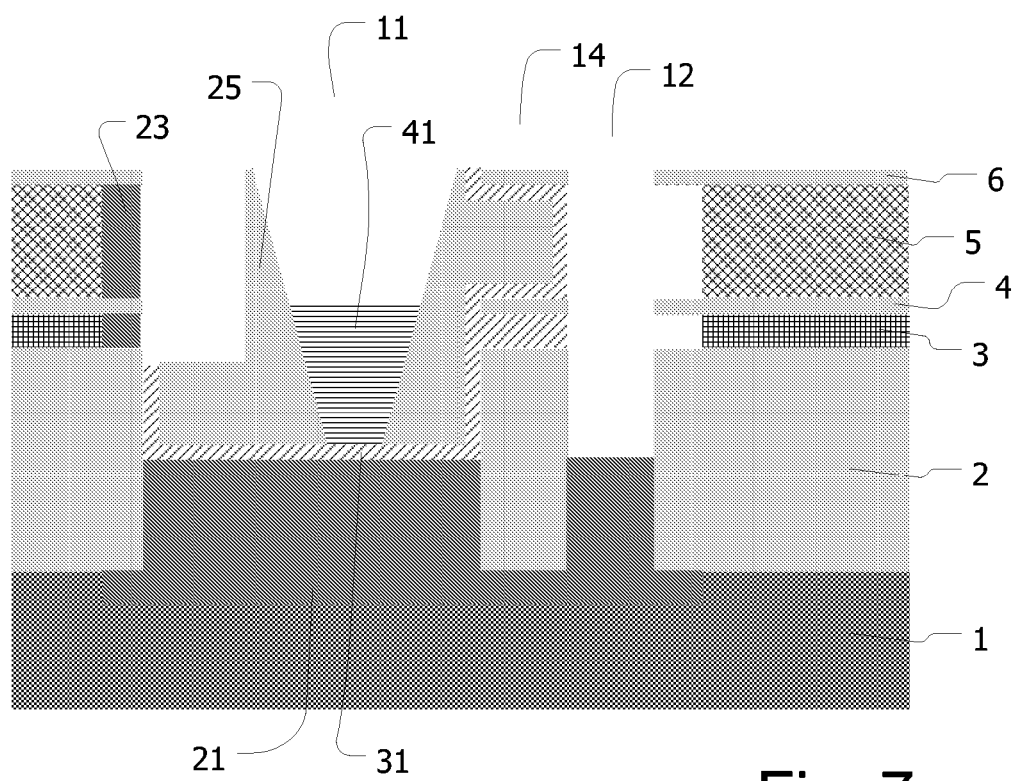

In the next fabrication steps the contacts to the collector region 21 and the base region 31 are formed. A standard silicon etching technique is applied to remove the sealing region 22, thereby exposing a portion of the collector region in the second trench 12, as is illustrated in FIG. 7. The silicon etching technique also removes a part of the emitter region 41 and a part of the sidewall region 23, which both comprise silicon and polysilicon.

Figure 8:
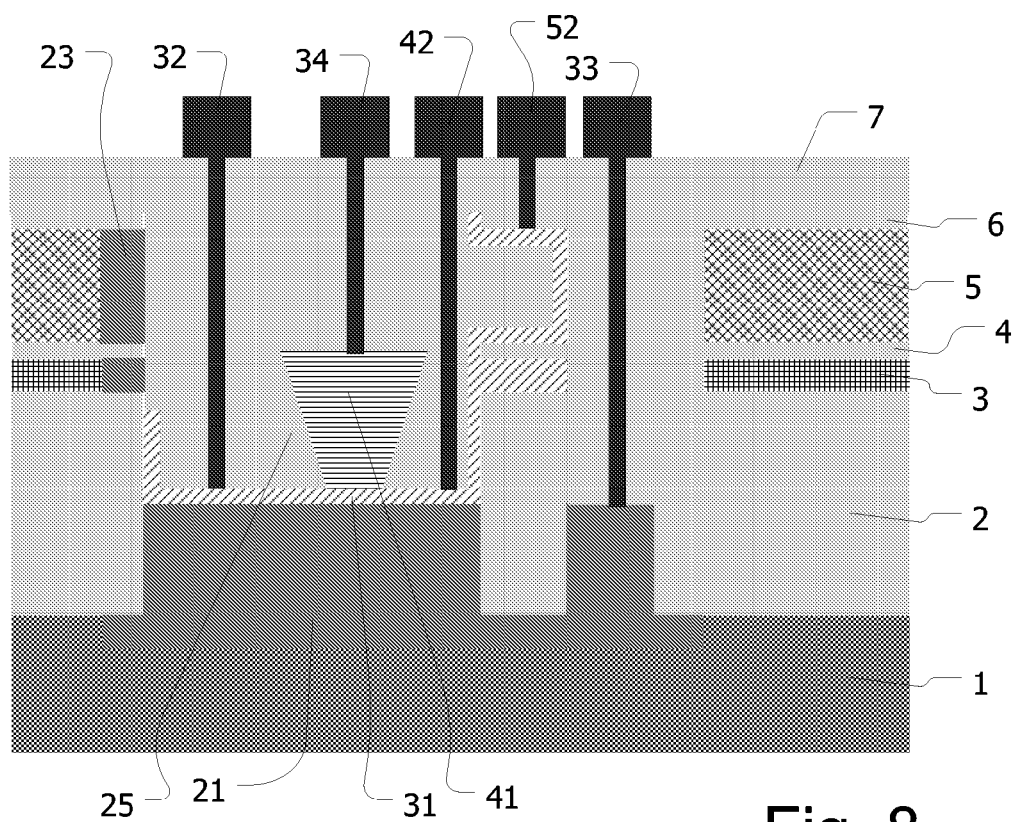

Thereafter, a silicon dioxide layer 7 is deposited which fills the remaining portions of the first trench 11 and the second trench 12, followed by a planarization step. Then, as is illustrated in FIG. 8, standard contact fabrication techniques are applied to form a collector contact 33 to the collector region 21, base contacts 32 and 42 to the base region 31 and an emitter contact 34 to the emitter region 41. A base contact 52 may also be formed on a portion of the base region 31, which extends over the protrusion 14. It is obvious that an embodiment may comprise any one of the base contacts 32, 42 or 52.

The fabrication of the bipolar transistor may be integrated in a standard CMOS process in which a CMOS device is fabricated comprising a gate electrode layer and a gate oxide layer. For this purpose the gate electrode layer comprises a portion of the polysilicon layer 5 and the gate oxide layer comprises a portion of the silicon dioxide layer 4.

In summary, a method of fabricating a bipolar transistor in a first trench is disclosed wherein only one photolithographic mask is applied which forms a first trench and a second trench. A collector region is formed self-aligned in the first trench and the second trench. A base region is formed self-aligned on a portion of the collector region, which is in the first trench. An emitter region is formed self-aligned on a portion of the base region. A contact to the collector region is formed in the second trench and a contact to the base region is formed in the first trench. The fabrication of the bipolar transistor may be integrated in a standard CMOS process.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A method for fabricating a bipolar transistor, the method comprising: providing a stack of layers on a semiconductor substrate, the stack of layers comprising a first isolation layer on the semiconductor substrate, a first semiconductor layer on the first isolation layer, a second isolation layer on the first semiconductor layer, and a second semiconductor layer on the second isolation layer, forming a first trench and a second trench in the stack of layers and in a portion of the semiconductor substrate, wherein the first trench and the second trench are separated by a protrusion which comprises a portion of the stack of layers and a first portion of the semiconductor substrate, removing the first portion of the semiconductor substrate, thereby creating an underpass region between the first trench and the second trench, in which the underpass region exposes a portion of the semiconductor substrate, forming a collector region on the exposed portions of the semiconductor substrate and a sealing region on the exposed portions of the first semiconductor layer and the second semiconductor layer, both regions comprising a semiconductor material, wherein the collector region fills the underpass region and the sealing region seals the second trench, forming a base region extending over a portion of the collector region in the first trench, forming spacers in the first trench, thereby forming an exposed portion of the collector region in the first trench, and forming an emitter region on the exposed portion of the collector region in the first trench.

2. The method as claimed in claim 1, further comprising the steps of: removing the sealing region, and forming a collector contact on an exposed portion of the collector region in the second trench.

3. The method as claimed in claim 2, further comprising the steps of: forming a base contact on a portion of the base region, which is in the first trench extending over the collector region.

4. The method as claimed in claim 2, in which the base region also extends over the protrusion and further comprising the steps of: forming a base contact on a portion of the base region, which is on the protrusion.

5. The method as claimed in claim 1, in which the semiconductor substrate, the first isolation layer and the first semiconductor layer are comprised in a Silicon-On-Insulator substrate.

6. The method as claimed in claim 1, in which the method is integrated in a CMOS fabrication process wherein a CMOS device is formed which comprises a gate dielectric, which comprises the second isolation layer, and a gate electrode, which comprises the second semiconductor layer.

* * * * *